May 15, 1973 W. A. CROSSLAND ET AL 3,733,182
THICK FILM CIRCUITS
Filed Jan. 21, 1971
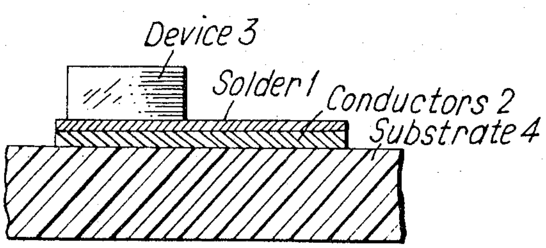
INVENTORS
WILLIAM A. CROSSLAND
COLIN A. MARR
LAURENCE HAILES
BY Stephen C. Young
ATTORNEY 3,733,182
THICK FILM CIRCUITS William Alden Crossland and Colin Andrew Marr, Harlow, and Laurence Hailes, Ware, England, assignors to International Standard Electric Corporation, New York, N.Y.

Filed Jan. 21, 1971, Ser. No. 108,660
Claims priority, application Great Britain, Feb. 6, 1970, 5,824/70
Int. Cl. B32b 15/04
U.S. Cl. 29—195 2 Claims

ABSTRACT OF THE DISCLOSURE

A tin-free lead cadmium solder (75% Pb, 25% Cd) is used to attach electrical devices to thick film palladium conductors. The use of this tin-free solder results in smaller loss of adhesion of the palladium to a substrate upon aging and at elevated temperatures.

BACKGROUND OF THE INVENTION

This invention relates to thick film circuits.

Devices are frequently added to thick film circuits by soldering. Most usually the printed and fired circuit is dipped in solder so that the conductive metallization (conductor tracks) are coated with solder, and the devices are subsequently attached by re-flowing the solder.

It has been observed that with tin containing solders, soldered conductors formed from many conductor preparations, particularly those employing palladium alloys, suffer a degradation of adhesion in the bonding to the insulating substrate on prolonged exposure to temperatures greater than ambient. This can lead to catastrophic adhesion failure.

The extent of this degradation depends on the conductor preparation, the substrate and also the solder. Tests have shown that for the above-mentioned class of conductors, degradation is related to tin diffusion into the conductor; giving rise to intermetallic formation and finally failure of adhesion.

It has been further shown that the effect is still present when conventional solders with low tin concentration are used.

SUMMARY OF THE INVENTION

According to one aspect of the invention, there is provided a method of manufacturing a thick film circuit of conductive metallization on an insulating substrate, which method includes the step of coating the bonded conductive metallization with tin-free solder.

According to another aspect of the invention, there is provided a thick film circuit comprising conductive metallization bonded to an insulating substrate, and a coating of tin-free solder on said bonded conductive metallization.

According to a further aspect of the invention, there is provided a method of assembling an electrical device to a thick film circuit of conductive metallization bonded to an insulating substrate, which method includes the step of attaching the device to the conductive metallization by tin-free solder.

According to a still further aspect of the invention, there is provided a thick film circuit assembly comprising an electrical device attached by tin-free solder to conductive metallization bonded to an insulating substrate.

BRIEF DESCRIPTION OF THE DRAWING

The drawing shows a device attached by tin-free solder to conductive metallization bonded to an insulating substrate.

DESCRIPTION OF THE PREFERRED EMBODIMENTS

Therefore a variety of tin-free solders have been tested, e.g. various lead-bismuth, lead-indium and lead-cadmium solders. It has been demonstrated that adhesion degradation can be considerably reduced by the use of tin-free solder 1 for coating the conductors 2 for subsequent reflowing for attachment of a device 3 or devices such as semiconductor and other components, etc., to the conductors, which conductors are bonded to insulating substrate 4. Said substrate can be of any suitable glass or ceramic material such as alumina or beryllia.

In a preferred example, with one commercially available gold-palladium conductor preparation, the fall in adhesion by exposure to a temperature of 150° C. for 168 hours was reduced from 80% with a tin-lead solder to 20% with a lead-cadmium solder of 75% by weight Pb, 25% by weight Cd.

This lead-cadmium solder composition is close to the eutectic point, and according to the required melting point of the solder the composition ratio may be varied typically by ±20%.

The tin-free solders may additionally contain small percentages of other metals to reduce dissolution of the conductors during the soldering process.

It is to be understood that the foregoing description of specific examples of this invention is made by way of example only and is not to be considered as a limitation on its scope.

We claim:

1. A thick film circuit comprising:
an insulating substrate;
a conductive metallization bonded to said substrate; and
a coating of tin-free solder which is 75%±20% by weight lead and 25%±20% by weight cadmium on said conductive metallization.

2. A thick film circuit according to claim 1, further comprising:
a device attached by said solder to said conductive metallization.

References Cited

UNITED STATES PATENTS

| | | | |
|---|---|---|---|
| 3,157,473 | 11/1964 | Acton | 29—195 X |
| 1,301,688 | 4/1919 | Gutevich et al. | 75—166 R |
| 1,333,666 | 3/1920 | Luckey | 75—166 R |
| 3,332,754 | 7/1967 | Dytrt | 29—195 |
| 3,386,906 | 6/1968 | Bronnes | 29—195 X |

L. DEWAYNE RUTLEDGE, Primary Examiner
E. L. WEISE, Assistant Examiner

U.S. Cl. X.R.

75—151, 166 R; 29—484; 117—217